(12) United States Patent
Lin et al.

(10) Patent No.: US 6,249,040 B1
(45) Date of Patent: Jun. 19, 2001

(54) SEMICONDUCTOR DEVICE HAVING A HIGH-DIELECTRIC CAPACITOR

(75) Inventors: Jun Lin; Masaaki Nakabayashi, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/450,509

(22) Filed: Nov. 30, 1999

(30) Foreign Application Priority Data

Dec. 1, 1998 (JP) .................................................. 10-341938

(51) Int. Cl.$^7$ .................................................. H01L 29/00
(52) U.S. Cl. .......................... 257/532; 257/534; 438/253
(58) Field of Search .................................. 257/532, 534; 438/197, 231, 253, 239

(56) References Cited

U.S. PATENT DOCUMENTS 5,744,387 * 4/1998 Tseng ..................................... 438/253
5,904,517 * 5/1999 Gardner et al. ....................... 438/197

OTHER PUBLICATIONS

Lin et al.; Applied Physics Letters (Apr. 19, 1999) vol. 74, No. 16, p. 2370–2.*

* cited by examiner

Primary Examiner—Olik Chaudhuri
Assistant Examiner—Theresa Doan
(74) Attorney, Agent, or Firm—Armstrong, Westerman, Hattori, McLeland & Naughton, LLP

(57) ABSTRACT

A high-dielectric capacitor is formed by using a Ru lower electrode having a (002)-oriented principal surface, by depositing thereon a $Ta_2O_5$ film such that the $Ta_2O_5$ film has a (100)-principal surface.

8 Claims, 17 Drawing Sheets

N2O plasma + RTN 800°C, 60S    Ta2O5/Ru(002)/TiN/Ti/SiO2/Si
Monocrystallized Ta2O5

← $Ta_2O_5(0\ 0\ 1)$

← $Ru(0\ 0\ 2)$

Annealing in $O_2$ at 700°C
Highly-crystallized Ta2O5 [Poly crystallized]

SEMICONDUCTOR DEVICE HAVING A HIGH-DIELECTRIC CAPACITOR

BACKGROUND OF THE INVENTION

The present invention generally relates to semiconductor devices and more particularly to a high-dielectric capacitor, a semiconductor having such a high-dielectric capacitor, and a fabrication process thereof.

With the advancement in the art of device miniaturization, the integration density of semiconductor integrated circuits, in which a number of semiconductor devices are integrated on a common substrate, is increasing every year. With this, device miniaturization is going on also for the individual semiconductor devices and the operational speed of the semiconductor devices is increasing also. In the case of memory semiconductor devices having a capacitor such as a DRAM, the device miniaturization also brings forth an increase of the amount of information stored in the memory semiconductor device.

On the other hand, in the semiconductor memory device such as a DRAM which store information in a memory cell capacitor in the form of electric charges, it should be noted that excessive device miniaturization causes a decrease in the electric charges held in the memory cell capacitor due to the decrease of the memory cell capacitance. Thereby, stable retention of information tends to become difficult. While it is possible to compensate for such a decrease of the capacitance to some extent by reducing the thickness of the capacitor insulation film, it is necessary to reduce the thickness of the capacitor insulation film to the order of several nanometers or less in the DRAMs of sub-micron or sub-quarter micron size, as long as a conventional $SiO_2$ film or an SiN film is used for the capacitor insulation film. As will be easily understood, formation of such an extremely thin capacitor insulation film is difficult, as it is required in a capacitor that the capacitor insulation film is perfectly free from defects such as pin holes. Further, the use of such a thin capacitor insulation film tends to cause the problem of increased tunneling leakage current.

Meanwhile, it has been proposed to use a $Ta_2O_5$ film for the capacitor insulation film of a DRAM memory cell capacitor.

FIGS. 1A–1D show the fabrication process of a MIS capacitor that uses a conventional $Ta_2O_5$ capacitor insulation film.

Referring to FIG. 1A, a capacitor region is defined on a Si substrate 11 by a field oxide film 12, and a polysilicon pattern 13 and an SiN pattern 14 are formed on the foregoing capacitor region in the step of FIG. 1B by depositing a polysilicon film and an SiN film consecutively and further by applying a patterning process, wherein the polysilicon pattern 13 forms a lower electrode of the capacitor. Typically, the SiN pattern 14 is formed with a thickness of 2 nm.

Next, in the step of FIG. 1C, a $Ta_2O_5$ film is deposited on the structure of FIG. 1B typically with a thickness of about 8 nm, followed by a patterning process to form a $Ta_2O_5$ capacitor insulation film 15. Further, the step FIG. 1D is conducted in which an upper electrode pattern 16 of Pt, and the like, is formed on the capacitor insulation film 15.

Because $Ta_2O_5$ is a simple oxide, it is possible to form the $Ta_2O_5$ capacitor insulation film 15 stably and with reliability in the step of FIG. 1C by a sputtering process or a CVD process. On the other hand, it is known that the bulk crystal of $Ta_2O_5$ has a dielectric constant of 30–40, and this value of dielectric constant is obtained also in the case of a $Ta_2O_5$ film. It should be noted that the foregoing dielectric constant is, while larger than the dielectric constant of $SiO_2$ or SiN, distinctly smaller than that of a perovskite complex oxide such as PZT ($Pb(Zr,Ti)O_3$) or STO ($SrTiO_3$) by a factor of 10.

Thus, if a method is found to realize a large dielectric constant in a $Ta_2O_5$ film, which is a simple oxide film, with a magnitude of the dielectric constant comparable to the dielectric constant of a perovskite complex oxide, the fabrication process of a large-capacitance memory cell capacitor would become substantially simplified and the cost of the semiconductor memory device using such a memory cell capacitor would be reduced.

SUMMARY OF THE INVENTION

Accordingly, it is a general object of the present invention to provide a novel and useful high-dielectric capacitor, a semiconductor device having such a high-dielectric capacitor, and a fabrication process thereof, wherein the foregoing problems are eliminated.

Another and more specific object of the present invention is to provide a capacitor having a $Ta_2O_3$ capacitor insulation film wherein the dielectric constant of the capacitor insulation film is maximized.

Another object of the present invention is to provide a semiconductor device having a capacitor wherein a capacitor insulation film of the capacitor is maximized.

Another object of the present invention is to provide a high-dielectric capacitor, comprising:
 a lower electrode;
 a capacitor insulation film of $Ta_2O_5$ formed on said lower electrode; and
 an upper electrode formed on said capacitor insulation film,
 said capacitor insulation film having a dielectric constant exceeding 100.

Another object of the present invention is to provide a semiconductor device, comprising:
 a substrate;
 a lower electrode provided on said substrate;
 a capacitor insulation film of $Ta_2O_5$ formed on said lower electrode; and
 an upper electrode formed on said capacitor insulation film;
 said capacitor insulation film having a dielectric constant exceeding 100 and comprising a crystal of $Ta_2O_5$ having a (001)-oriented surface.

A method of fabricating a high-dielectric capacitor, comprising the steps of:
 forming a Ru film having a (002)-oriented principal surface on a substrate as a lower electrode;
 depositing a $Ta_2O_5$ film on said Ru film as a capacitor insulation film;
 oxidizing said $Ta_2O_5$ film; and
 crystallizing said $Ta_2O_5$ film.

According to the present invention, a $Ta_2O_5$ film having a very large dielectric constant is obtained by properly controlling the crystal orientation of the $Ta_2O_5$ film. Because of the large dielectric constant of the capacitor insulation film, the capacitor shows a large capacitance and can be used successfully for a memory cell capacitor of extremely miniaturized memory semiconductor devices such as DRAMs fabricated according to the sub-micron or sub-quarter micron design rule. It was further discovered that such a Ta$_2$O$_5$ film having a very large dielectric constant can be formed easily with low cost and with excellent reproducibility, by conducting a sputtering process, followed by a low temperature oxidation process, and further by a rapid thermal annealing (RTA) process.

Other objects and further features of the present invention will become apparent from the following detailed description when read in conjunction with the attached drawings.

DETAILED DESCRIPTION OF THE PREFERRED EMBODIMENTS

[PRINCIPLE]

Figure 1A:
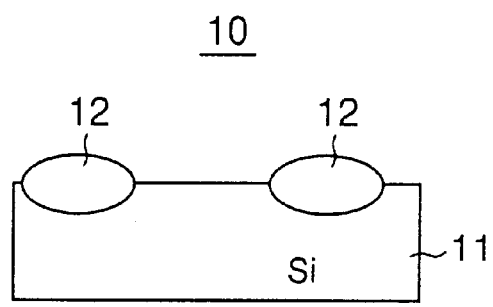
FIGS. 1A–1D are diagrams explaining the fabrication process of a conventional high-dielectric capacitor.
Figure 1B:
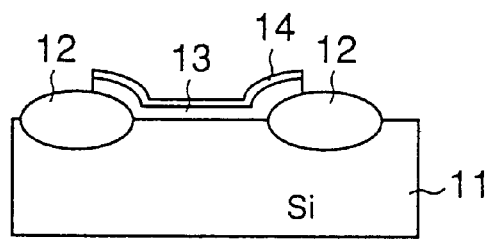

FIGS. 2A–2D show the principle of a high-dielectric capacitor 20 according to the present invention, wherein those parts corresponding to the parts described previously are designated by the same reference numerals and the description thereof will be omitted.

Figure 2A:
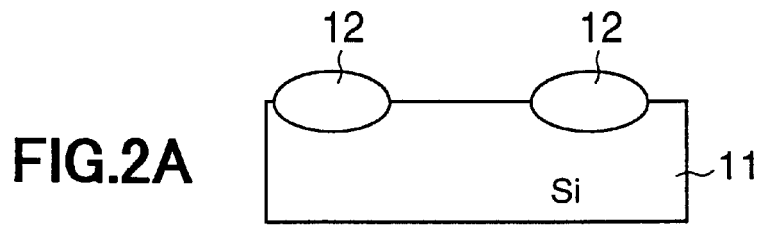
FIGS. 2A–2D are diagrams explaining the principle of the present invention.
Figure 2B:
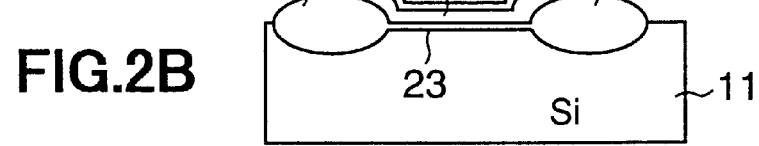

Referring to FIG. 2A, a capacitor region is defined on the Si substrate 11 by the field oxide film 12 similarly to the high-dielectric capacitor 10, and the step of FIG. 2B is conducted in which an SiO$_2$ film 23 is formed on the capacitor region of the Si substrate 11 by an oxidizing process or a CVD process.

In the step of FIG. 2B, a Ti pattern and a TiN pattern are formed on the SiO$_2$ film 23 respectively by a sputtering process and a reactive sputtering process to form an underlying film 24, and a Ru pattern 25 is formed thereon as a lower electrode. The Ru pattern 25 is formed by a sputtering process conducted in an Ar atmosphere under a pressure of 5 mTorr, while using a sintered body of Ru as a target. The deposition of the Ru film 25 is conducted typically at about 300° C.

Figure 2C:
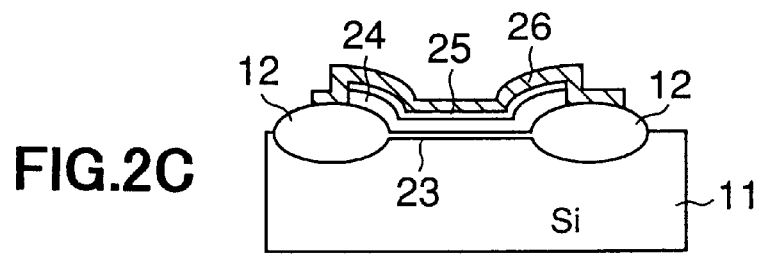

Next, in the step of FIG. 2C, a Ta$_2$O$_5$ pattern 26 is formed on the structure of FIG. 2B as a capacitor insulation film, such that the Ta$_2$O$_5$ pattern 26 covers the lower electrode 25. Typically, the Ta$_2$O$_5$ pattern 26 is formed by a sputtering process with a thickness of about 8 nm.

Figure 2D:
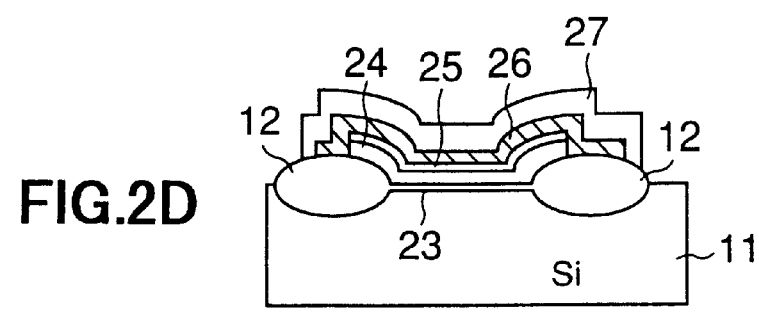

Further, in the step of FIG. 2D, an upper electrode 27 of Pt is formed by a sputtering process, such that the upper electrode 27 covers the capacitor insulation film 26.

In the foregoing step of FIG. 2C, it should be noted that the Ta$_2$O$_5$ pattern 26 is formed by a sputtering process conducted in an oxygen-free Ar atmosphere under a pressure of 0.005 Torr or less while setting the substrate temperature to 280° C. or higher, preferably about 300° C. The Ta$_2$O$_5$ pattern 26 thus formed is generally in amorphous state immediately after the deposition and contains oxygen defects. The oxygen defects in the Ta$_2$O$_5$ pattern 26 are compensated for by exposing the Ta$_2$O$_5$ pattern 26 thus formed to an N$_2$O or O$_2$ plasma for 1–1.5 minutes at the substrate temperature of 300–450° C. Further, by applying a rapid thermal annealing (RTA) process to the Ta$_2$O$_5$ pattern 26 at 750–800° C. in an N$_2$ atmosphere or an Ar atmosphere for 20–120 seconds, the Ta$_2$O$_5$ pattern 26 undergoes crystallization.

Figure 1C:
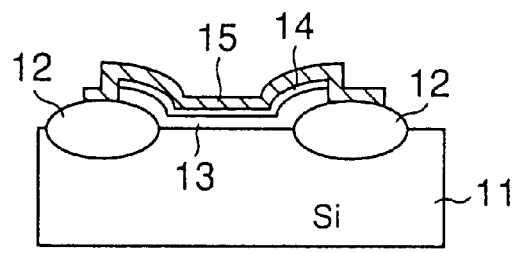
Figure 1D:
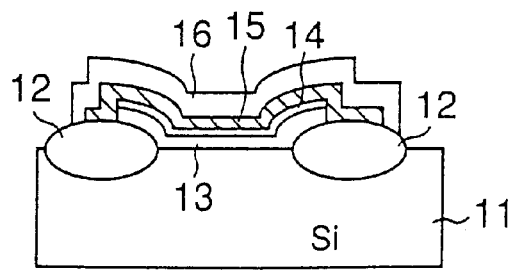
Figure 3A:
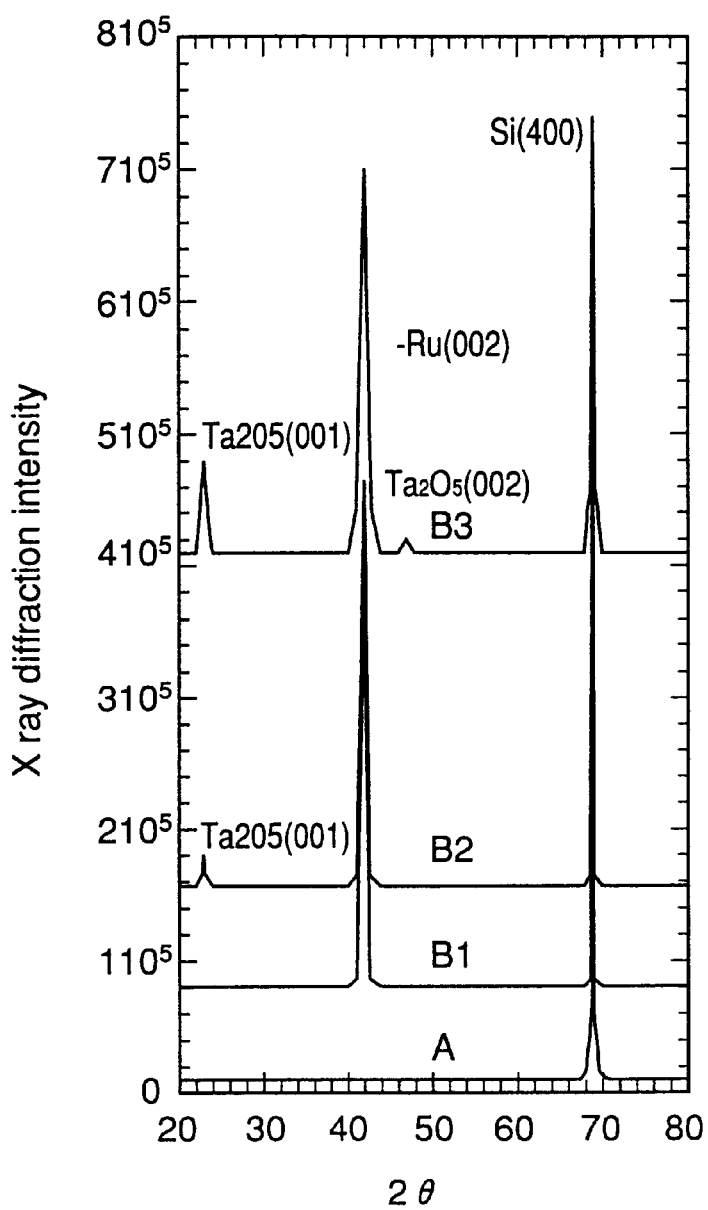
FIGS. 3A and 3B are diagrams showing the X-ray diffraction pattern of a high-dielectric film formed on the lower electrode.
Figure 3B:
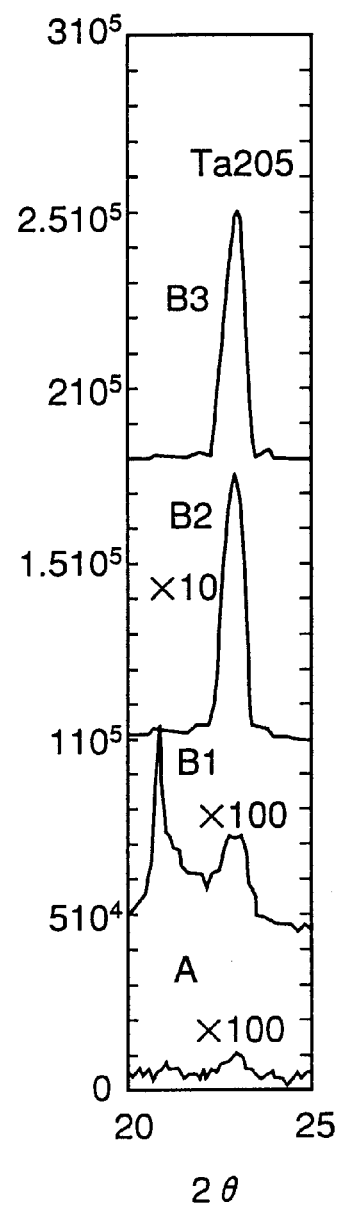

FIGS. 3A and 3B show an X-ray diffraction pattern of the Ta$_2$O$_5$ film 26 in the state of FIG. 2C, wherein it should be noted that FIG. 3B shows a part of FIG. 3A in an enlarged scale. In FIGS. 3A and 3B, the pattern designated as "A" represents the X-ray diffraction pattern of the conventional Ta$_2$O$_5$ film 15 of FIG. 1C after a thermal annealing process conducted in an oxidizing atmosphere at about 850° C., while the pattern "B$_1$" represents the X-ray diffraction pattern for the case in which the RTA process of FIG. 2C is conducted at 800° C. in an N$_2$ atmosphere. Further, the pattern "B$_2$" represents the X-ray diffraction pattern in which the RTA process of FIG. 2C is conducted at 800° C. in an O$_2$ atmosphere, while the pattern "B$_3$" represents the X-ray pattern in which an N$_2$O plasma processing is applied to the Ta$_2$O$_5$ film 26 in the step of FIG. 2C at a temperature of 300–450° C., followed by an RTA process conducted in an N$_2$ atmosphere at 800° C.

Referring to FIG. 3A, it can be seen that all the specimen, except for the specimen A, show a clear (002) reflection peak of Ru constituting the lower electrode 25. It is believed that this is caused as a result of the Ti film, formed on the SiO$_2$ film 23 as a part of the TiN/Ti layer 24 located underneath the lower electrode 25, has a strong self-alignment tendency in the <002>direction, and because of this, the TiN film formed on the (002)-oriented principal surface of the Ti film thus formed has a (111)-oriented principal surface. By depositing the Ru electrode film 25 on such a (111)-oriented surface of TiN, the Ru electrode film 25 is aligned in the <002>direction and it is believed that this is the reason why the X-ray diffraction peak shows the (002) reflection peak of Ru.

Thus, in the high-dielectric capacitor of the present invention, the Ru lower electrode 25 thus grown on the (111)-oriented principal surface of the TiN film has a (002)-oriented principal surface, and the Ta$_2$O$_5$ film 26 thus grown on such a TiN film is aligned in the <001>direction as represented by the (001) reflection peak shown in FIGS. 3A and 3B.

As can be seen in FIG. 33B, the (001) reflection peak of Ta$_2$O$_5$ is low in the specimen B$_1$, while a strong reflection is observed for the Ta$_2$O$_5$ (001) surface in the specimen B$_2$ or B$_3$. In the conventional high-dielectric capacitor 10, on the other hand, the maximum reflection was obtained for the Ta$_2$O$_5$ film with regard to the (101) surface.

Figure 4:
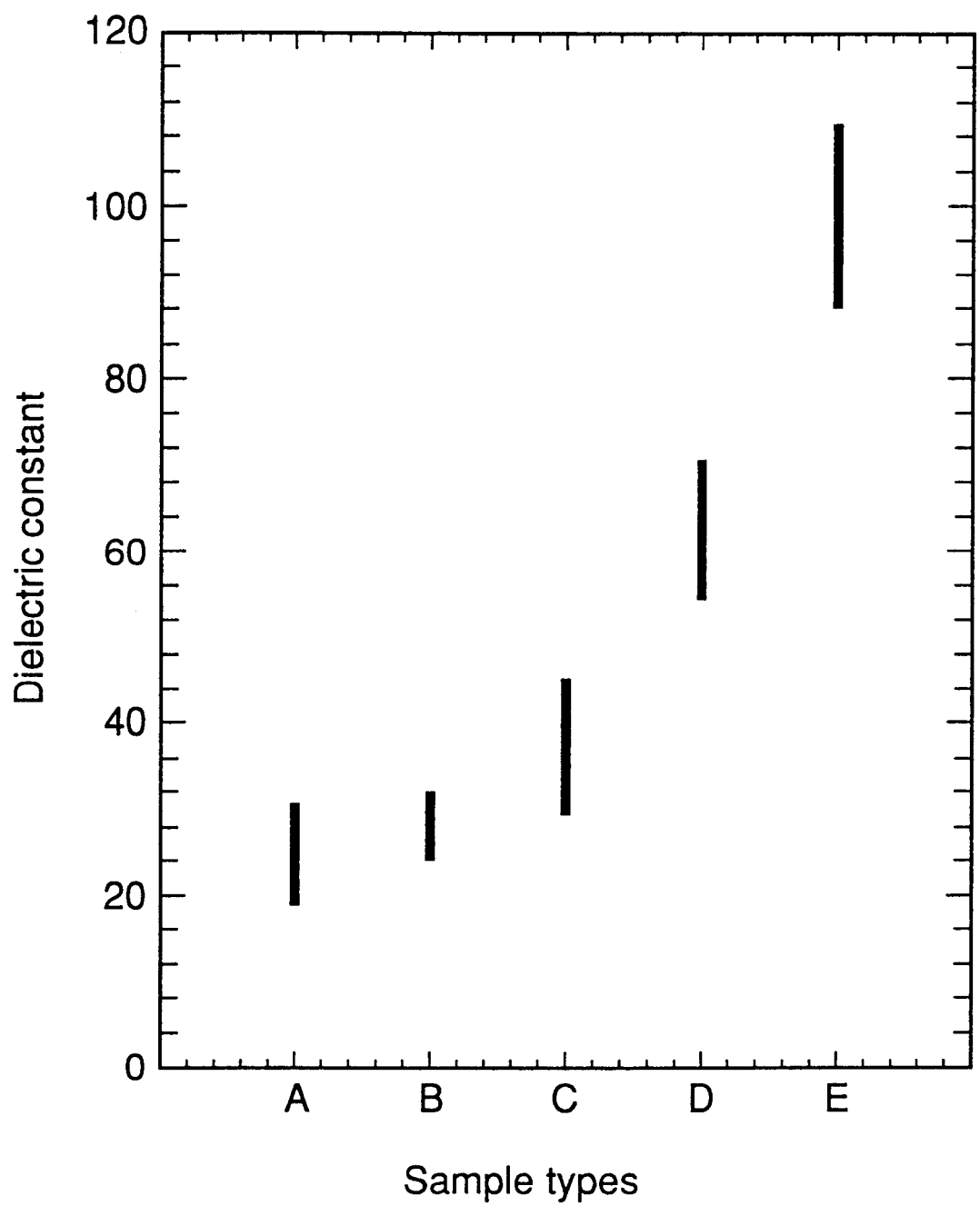
FIG. 4 is a diagram showing the dielectric constant of the high-dielectric film according to the present invention in comparison with the dielectric constant of a conventional high-dielectric film.

FIG. 4 shows the dielectric constant of the Ta$_2$O$_5$ capacitor dielectric film thus obtained for a high-dielectric capacitor.

Referring to FIG. 4, the specimen A corresponding to the specimen A of FIGS. 3A and 3B merely shows a mediocre value of 20–30 for the dielectric constant. A similar value is obtained when the lower electrode 14 is formed on an SiN film.

The specimen B of FIG. 4 shows, on the other hand, the dielectric constant of the $Ta_2O_5$ film 26 in the state immediately after the $Ta_2O_5$ film formed on the (002)-oriented principal surface of the Ru electrode 25 by a sputtering process with a thickness of 8 nm. In this case, too, the dielectric constant takes a mediocre value of 25–32.

Further, FIG. 4 shows, in the specimen C, the result in which the $Ta_2O_5$ film 26, formed on the (002)-oriented principal surface of the Ru electrode 25 with the thickness of 8 nm, is annealed in the air (0.06 Torr) or in vacuum at 350–650° C. In the specimen C, it can be seen that the dielectric constant has increased slightly over the case of the specimen A or B and reaches a value of 30–45. Further, FIG. 4 shows, in the specimen D, the result in which the annealing temperature of the specimen C is increased to more than about 700° C. In this case, it can be seen that the dielectric constant of $Ta_2O_5$ has increased to 55–70.

Further, FIG. 4 shows, in the specimen E corresponding to the specimen $B_3$ explained before, the result in which the amorphous $Ta_2O_5$ film 26 deposited on the (002)-oriented principal surface of the Ru electrode 25 is exposed to an $N_2O$ plasma at 350° C. for 3 minutes, followed by an RTA process conducted in an $N_2$ atmosphere at 800° C. for 1 minute. As can be seen in FIG. 4, the $Ta_2O_5$ film thus processed provides the dielectric constant of 90–100. In the case the process temperature is reduced to 700° C. in the specimen E, the dielectric constant of the $Ta_2O_5$ film 26 is reduced to 55–70. As explained before, the $Ta_2O_5$ film 26 of the specimen E is defined by the (001)-oriented principal surface.

Summarizing above, it becomes possible to increase the dielectric constant of the $Ta_2O_5$ film 26 by employing the processing of the specimen E, wherein the magnitude of the dielectric constant thus obtained is larger by a factor of as much as 12 as compared with the case of a conventional $Ta_2O_5$ film 15 of the same thickness used in the high-dielectric capacitor 10.

Figure 5:
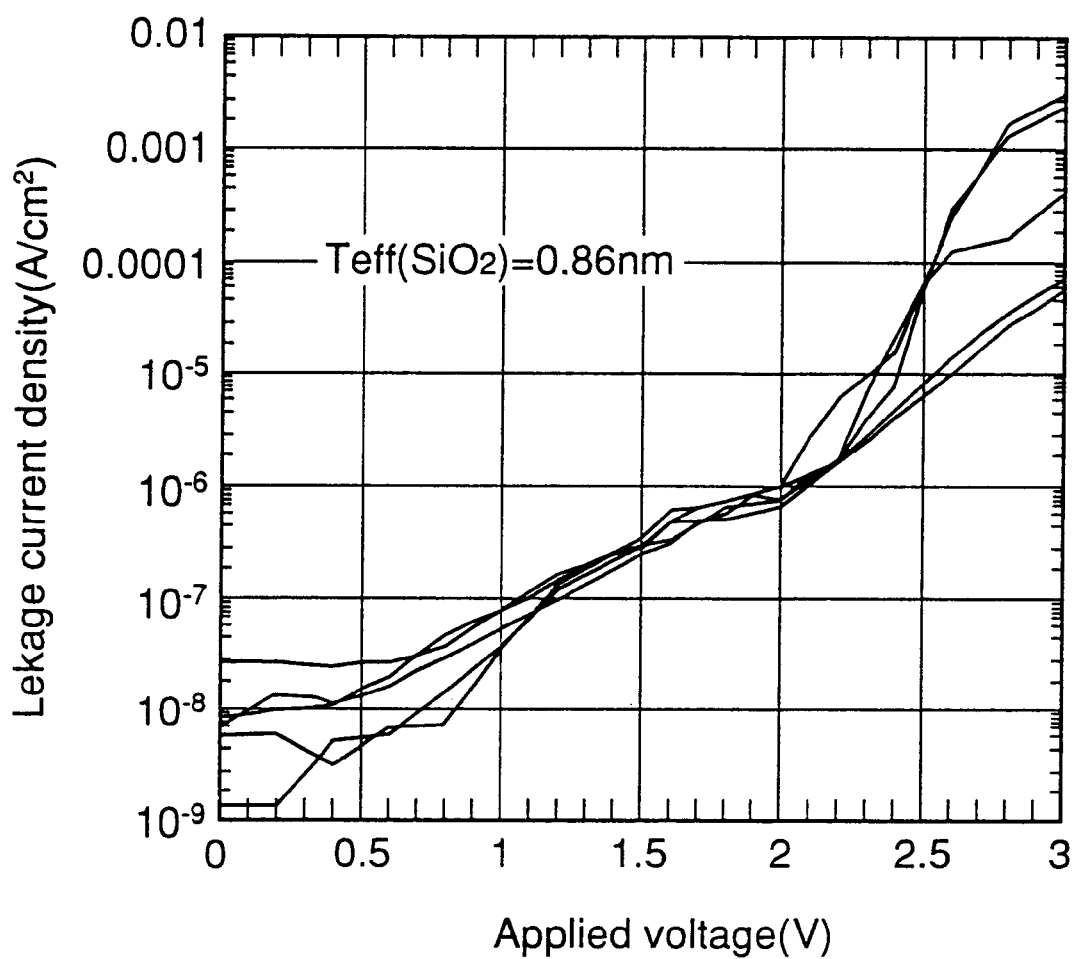
FIG. 5 is a diagram showing the leakage current of a high-dielectric capacitor according to the present invention.

FIG. 5 shows the leakage current of the high-dielectric capacitor 20 that uses the $Ta_2O_5$ film of the specimen E. In the sample capacitor used in the experiment of FIG. 5, the $Ta_2O_5$ film has a thickness of 28 nm, and the TiN/Ti underlying layer 24 is formed directly on the Si substrate 11. In the foregoing construction, a leakage current of $4.6 \times 10^{-8}$ $A/cm^2$ or less is observed when a voltage of 1V is applied across the capacitor. In the sample capacitor of FIG. 5, it should be noted that the equivalent thickness of the $Ta_2O_5$ film, which is the thickness of the $Ta_2O_5$ film converted to the thickness of an $SiO_2$ film, is 0.86 nm.

Figure 6:
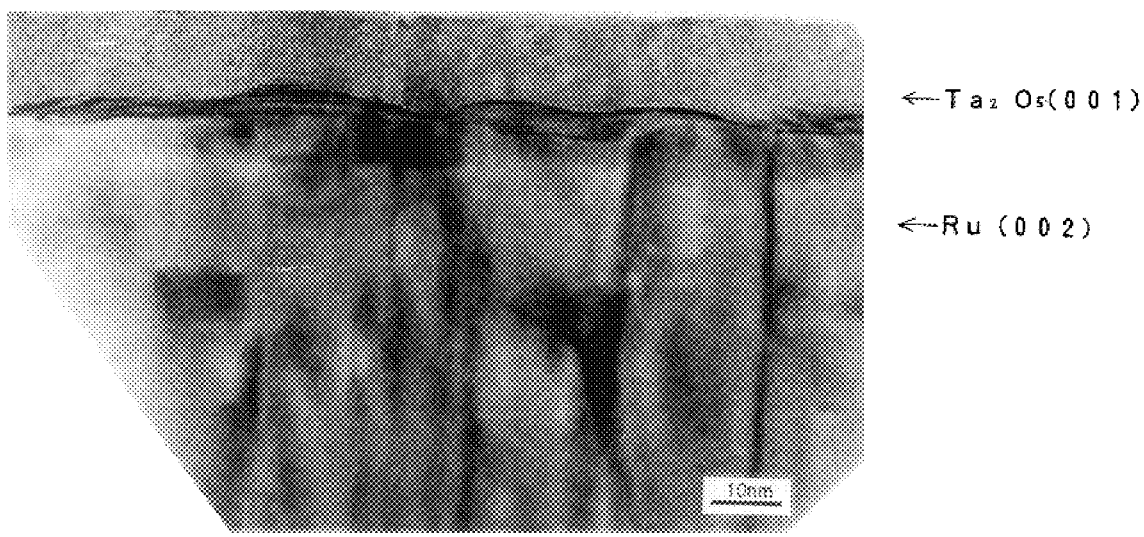
FIG. 6 is a diagram showing a cross-sectional TEM image of the high-dielectric capacitor according to the present invention.

FIG. 6 shows the TEM image of the $Ta_2O_5$ film corresponding to the specimen E, wherein the $Ta_2O_5$ film has the (001)-oriented principal surface and is formed on the (002)-oriented principal surface of a Ru film.

Referring to FIG. 6, the $Ta_2O_5$ film forms a plate-like crystal having a near single-crystal structure on the (002)-oriented principal surface of Ru. As can be seen in FIG. 6, a lattice image is observed for the $Ta_2O_5$ film.

Figure 7:
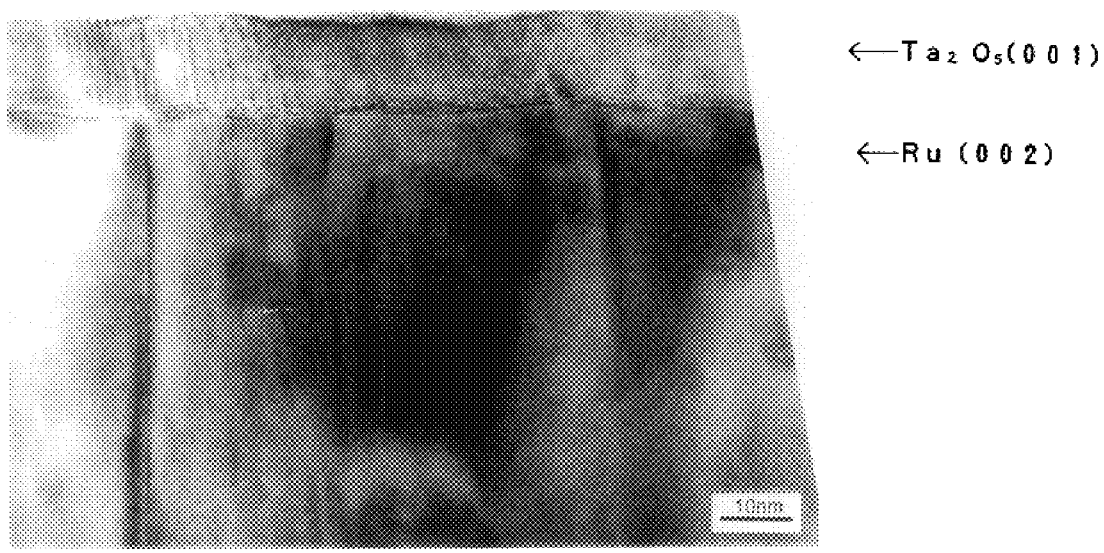
FIG. 7 is a diagram showing a cross-sectional TEM image of another high-dielectric capacitor represented for the sake of comparison.

FIG. 7, on the other hand, shows the TEM image of a $Ta_2O_5$ film formed according to a different condition. As can be seen, the $Ta_2O_5$ film does not have a single crystal structure but is formed of an aggregate of columnar crystals.

[FIRST EMBODIMENT]

FIGS. 8A–8K show the fabrication process of a high-dielectric capacitor according to a first embodiment of the present invention.

Figure 8A:
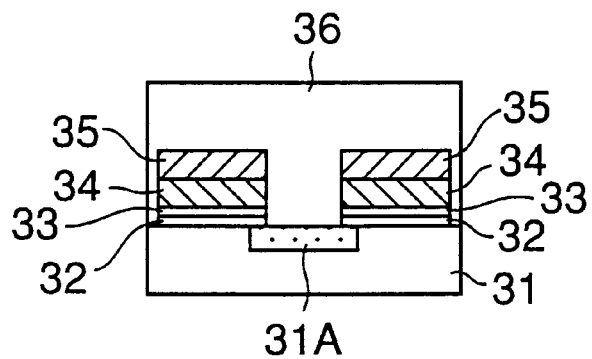
FIGS. 8A–8K are diagrams showing the fabrication process of a high-dielectric capacitor according to a first embodiment of the present invention.

Referring to FIG. 8A, a diffusion region 31A is formed in a substrate 31, and an insulation film 32 of typically $SiO_2$ is formed on the substrate adjacent to the diffusion region 31A. On the insulation film 32, a Ti film 33 and a TiN film are formed consecutively, and a conductor pattern 35 of typically W is formed on the TiN film 34 as an interconnection pattern. Further, the interconnection pattern 35 is covered by an interlayer insulation film 36. The conductor pattern 35 may form the gate electrode of a MOS transistor.

Figure 8B:
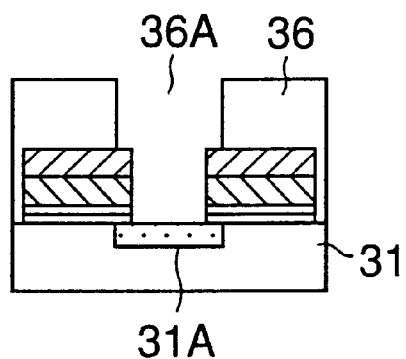
Figure 8C:
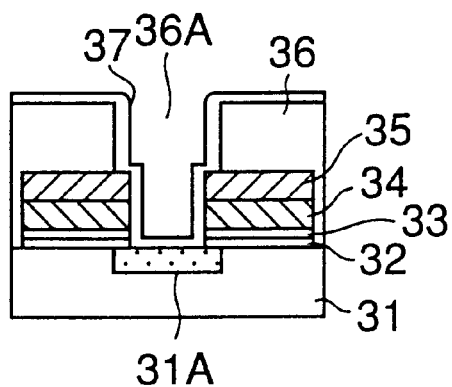
Figure 8D:
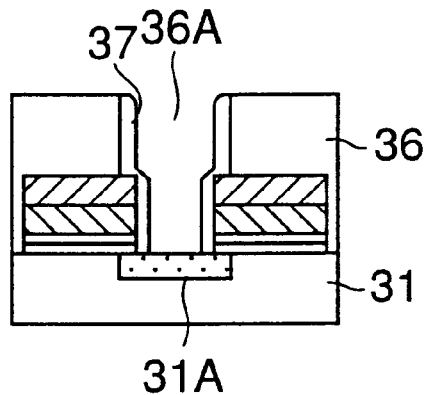

Next, in the step of FIG. 8B, a contact hole 36A is formed in the interlayer insulation film 36 so as to expose the diffusion region 31A, and an $SiO_2$ film 37 is deposited in the step of FIG. 8C so as to cover the side wall of the contact hole 36A and the exposed surface of the diffusion region 31A.

Next, in the step of FIG. BD, the $SiO_2$ film 37 is etched back until the diffusion region 31A is exposed, wherein the $SiO_2$ film 37 forms a side wall insulation film covering the side wall of the contact hole 36A.

Figure 8E:
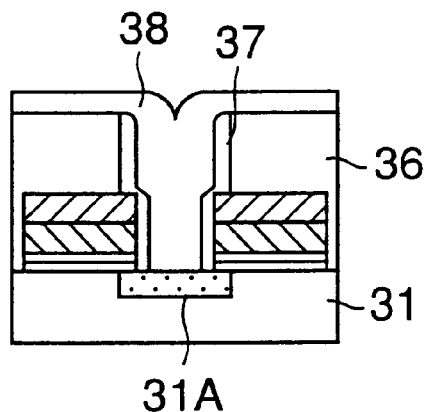
Figure 8F:
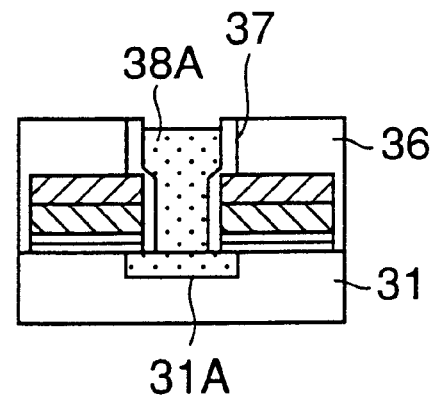

Next, in the step of FIG. 8E, a conductive layer 38 of polysilicon or amorphous silicon is deposited on the structure of FIG. 8E by a CVD process, and the conductive layer covering the top surface of the interlayer insulation film 36 is removed by a CMP process in the step of FIG. 8F. As a result, there is formed a conductive plug 38A filling the contact hole 36A.

Figure 8G:
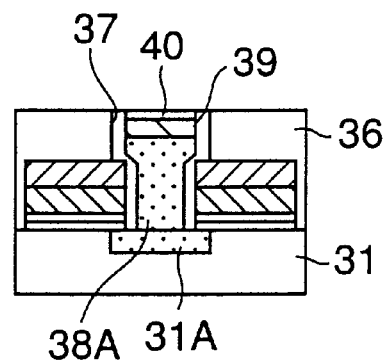

After etching back the conductive plug 38A slightly, a Ti film 39 and a TiN film 40 are deposited in the step of FIG. 8G on the conductive plug 38A respectively by a sputtering process and a reactive sputtering process.

Figure 8H:
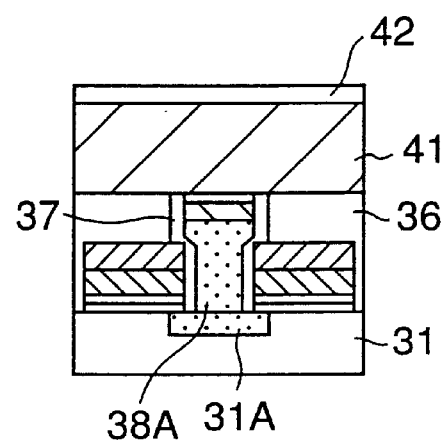
Figure 8:
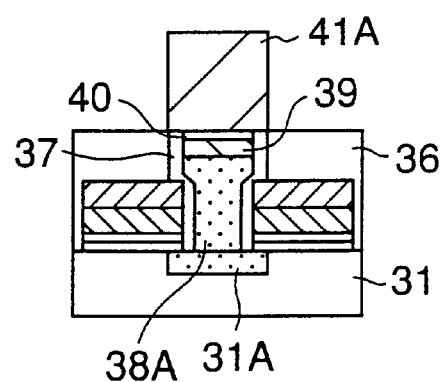

Next, in the step of FIG. 8H, a Ru film 41 is deposited on the interlayer insulation film 36 by a sputtering process so as to cover the TiN film 40 on the conductive plug 38A, and a hard mask layer 42 of $SiO_2$ or TiN is deposited further on the Ru film 41.

Next, in the step of FIG. 8I, the hard mask layer 42 is patterned to form a hard mask pattern, and the Ru film 41 is patterned while using the hard mask pattern as a mask, to form a lower electrode pattern 41A.

Figure 8J:
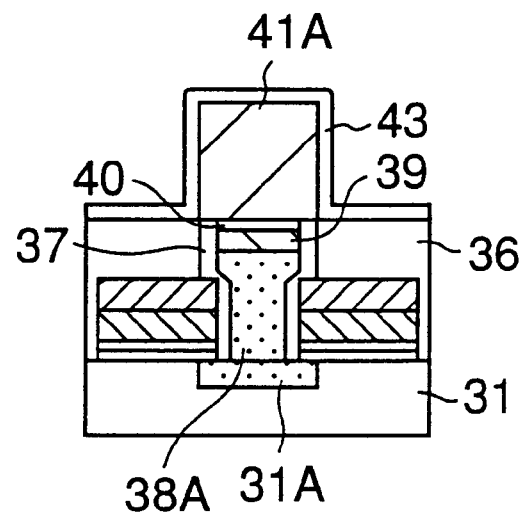

Next, in the step of FIG. 8J, a $Ta_2O_5$ film 43 is deposited on the interlayer insulation film 36 by a sputtering process so as to cover the lower electrode pattern 41A, followed by an exposure process to an $N_2O$ plasma or $O_2$ plasma at 300–450° C., typically at 350° C. for 1–5 minutes. After the foregoing plasma process, the $Ta_2O_5$ film is annealed in an $N_2$ atmosphere at 700–850° C., preferably at about 800° C. for 20–120 minutes.

Figure 8K:
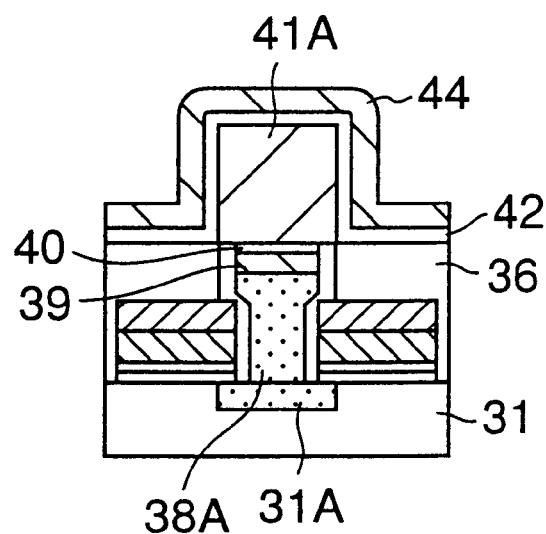

Further, in the step of FIG. 8K, an upper electrode 44 of Pt is deposited on the structure of FIG. 11J such that the upper electrode 44 covers the $Ta_2O_5$ film 43.

In the structure of FIG. 8K, it will be noted that a high-dielectric capacitor having the $Ta_2O_5$ film 43 as the capacitor insulation film is formed on the interlayer insulation film 36, in the state that the high-dielectric capacitor is connected electrically to the diffusion region 31A in the substrate 31 via the conductive plug 38A, the Ti film 39 and the TiN film 40. In such a high-dielectric capacitor, it should be noted that the lower electrode 41 of Ru has a (002)-oriented principal surface. Thus, the $Ta_2O_5$ capacitor insulation film 43 thus formed on the Ru lower electrode 41 has a (001)-oriented principal surface, similarly to the specimen $B_3$ shown in FIGS. 3A and 3B. Thereby, the $Ta_2O_5$ capacitor insulation film 43 has a large dielectric constant similar to the specimen E of FIG. 4, and the high-dielectric capacitor of the present embodiment has a large capacitance.

In the high-dielectric capacitor of the present embodiment, it is also possible to use a W film and a $WN_x$ film in place of the Ti film 39 and the TiN film 40 respectively. Such a W film is formed easily by a sputtering process, while the $WN_x$ film is formed by annealing the W film thus deposited in an $NH_3$ atmosphere at 700–800° C. for 5–60 minutes.

[SECOND EMBODIMENT]

FIGS. 9A–9H are diagrams showing the fabrication process of a DRAM 50 according to a second embodiment of the present invention.

Figure 9A:
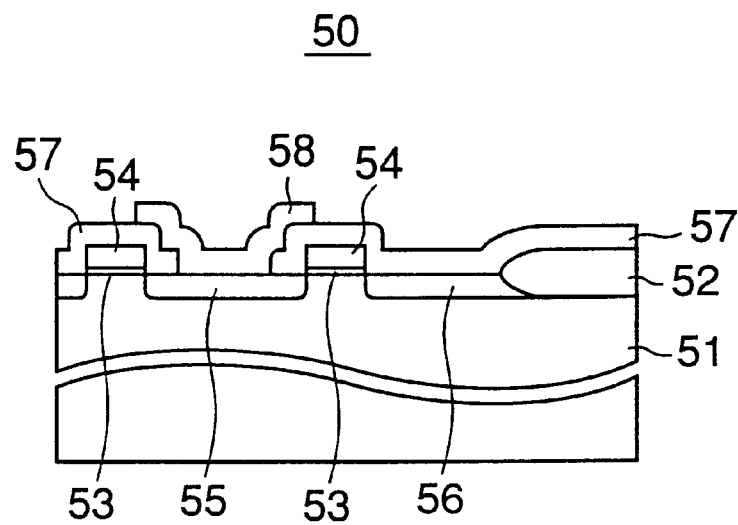
FIGS. 9A–9H are diagrams showing the fabrication process of a DRAM according to a second embodiment of the present invention.

Referring to FIG. 9A, a memory cell region is defined on a p-type Si substrate 51 by a field oxide film 52, and a gate insulation film 53 is formed on the Si substrate 51 so as to cover the memory cell region. Further, a pair of gate electrodes 54 are formed on the gate insulation film 53 similarly to an ordinary MOS transistor. As is commonly practiced in the art, each of the gate electrodes 54 constitutes a part of the word line crossing the memory cell region. Further, n-type diffusion regions 55 and 56 are formed in the substrate 51 at the lateral sides of the gate electrodes 54 while using the gate electrodes 54 as a self-alignment mask.

After the MOS transistor is thus formed, an $SiO_2$ film 57 is formed on the substrate 51 by a CVD process so as to cover the gate electrodes 54, and a contact hole is formed in the $SiO_2$ film 57 by a photolithographic process so as to expose the diffusion region 55.

After the formation of the contact hole, the $SiO_2$ film 57 is covered by a WSi layer such that the WSi layer makes a contact with the diffusion region 55 at the contact hole. By patterning the WSi layer, a bit line electrode 58 is formed as represented in FIG. 9A.

Figure 9B:
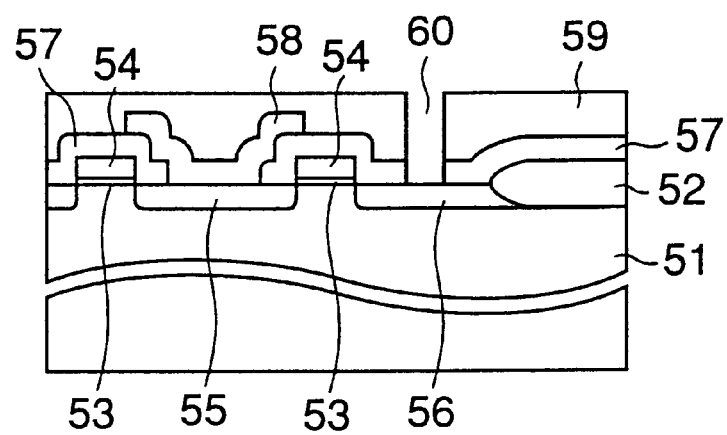

Next, in the step of FIG. 9B, an interlayer insulation film 59 of typically $SiO_2$ is deposited on the structure of FIG. 9A, followed by a planarization process conducted by a CMP process, and a deep contact hole 60 is formed in the interlayer insulation film 59 by a high-resolution photolithographic process so as to expose the diffusion region 56.

Figure 9C:
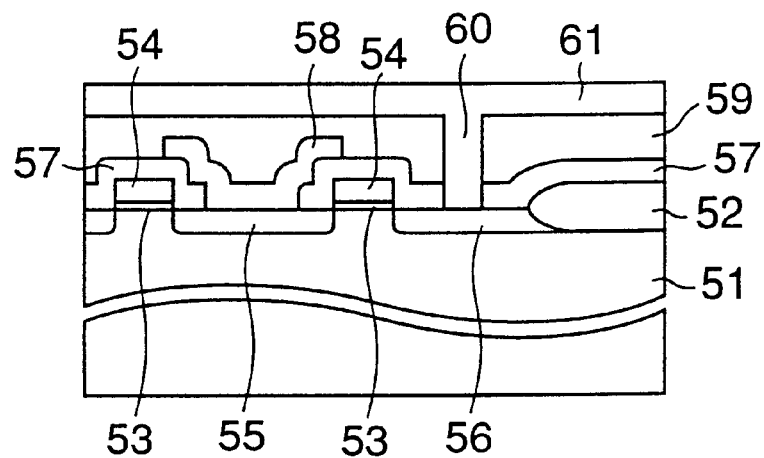
Figure 9D:
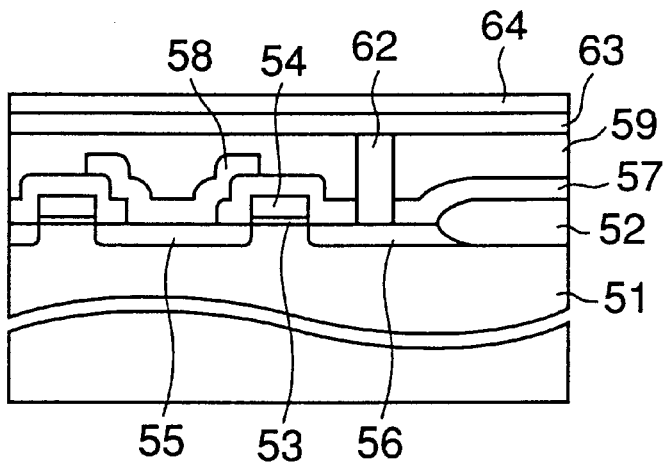

Next, in the step of FIG. 9C, a polysilicon film 61 doped to the $n^+$-type by P is deposited on the structure of FIG. 9B by a CVD process so as to fill the contact hole 60, wherein the polysilicon film 61 thus formed is subjected to an etch-back process by a dry etching process in the step of FIG. 9D, until the surface of the interlayer insulation film 59 is exposed. As a result, a structure is obtained in which the contact hole is filled with a polysilicon plug 62.

In the step of FIG. 9D, it should be noted that a Ti film (not shown) is further deposited on the interlayer insulation film 59 so as to cover the polysilicon plug 62, and a TiN film (not shown) is deposited further thereon by a reactive sputtering process as a diffusion barrier. In the step of FIG. 13D, a Ru film 63 having a (002)-oriented principal surface is deposited on the TiN film thus formed by a sputtering process conducted in an Ar atmosphere typically at a substrate temperature exceeding about 280° C., and a $Ta_2O_5$ film 64 is deposited on the Ru film 63 by a sputtering process conducted in an Ar atmosphere. The $Ta_2O_5$ film 64 thus deposited is processed in an $N_2O$ plasma or an $O_2$ plasma at the temperature of 300–450° C. for 1–5 minutes so as to compensate for the oxygen defects existing in the $Ta_2O_5$ film 64. Further, the $Ta_2O_5$ film 64 thus processed is then subjected to an RTA process conducted in an inert atmosphere of $N_2$, and the like, at the temperature of 700–850° C. for 20–120 seconds, wherein the $Ta_2O_5$ film 64 thus subjected to the RTA process undergoes crystallization. The $Ta_2O_5$ film 64 thus formed has a (001)-oriented principal surface and a dielectric constant of 90–110 or more, as explained with reference to FIGS. 3A and 3B.

Figure 9E:
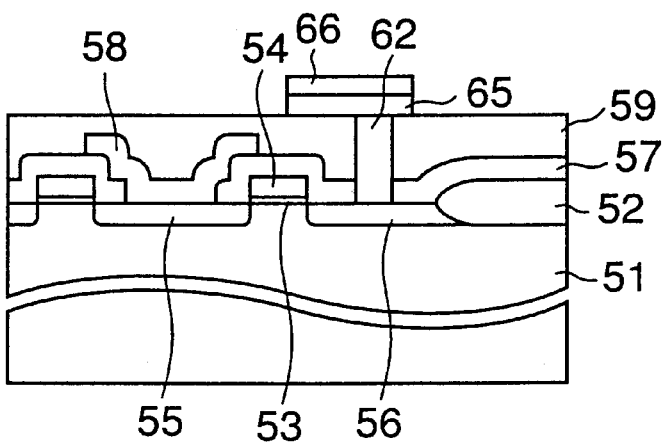

Next, in the step of FIG. 9E, the $Ta_2O_5$ film 64 and the underlying Ru film 63 are patterned by a photolithographic process, wherein a lower electrode 65 is formed as a result of the patterning of the Ru film 63 while a capacitor insulation film 66 is formed as a result of the patterning of the $Ta_2O_5$ film 64.

Figure 9F:
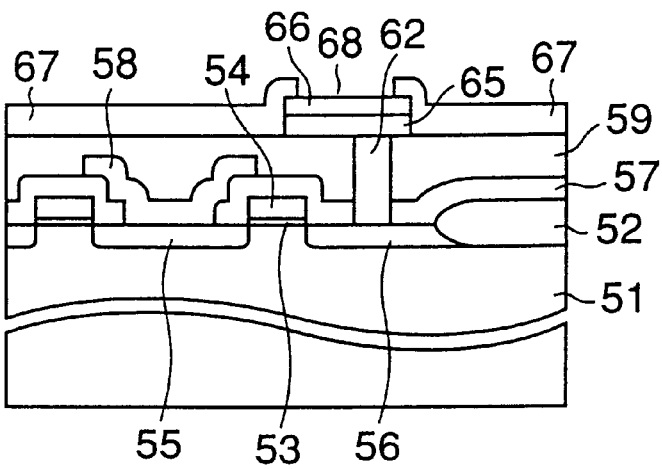
Figure 9G:
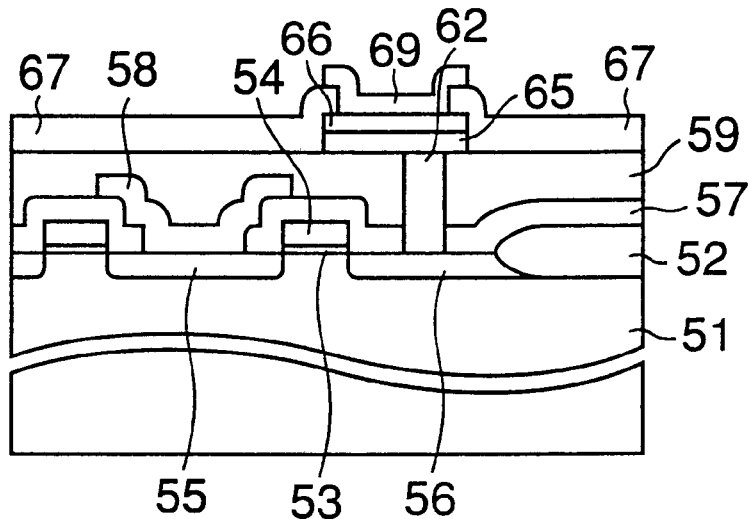

Next, in the step of FIG. 9F, an $SiO_2$ film 67 is deposited on the structure of FIG. 9E by a CVD process so as to cover the capacitor insulation film 66, and a contact hole 68 is formed in the $SiO_2$ film 67 so as to expose the capacitor insulation film 66. Further, a Pt pattern 69 is formed on the $SiO_2$ film 67 in the step of FIG. 9G so as to cover the exposed capacitor insulation film 66 as an upper electrode of the high-dielectric capacitor. Further, in the step of FIG. 9H, an interlayer insulation film 70 is deposited on the $SiO_2$ film 67 so as to cover the upper electrode 69. The interlayer insulation film 70 may carry thereon an interconnection pattern 71.

Figure 9H:
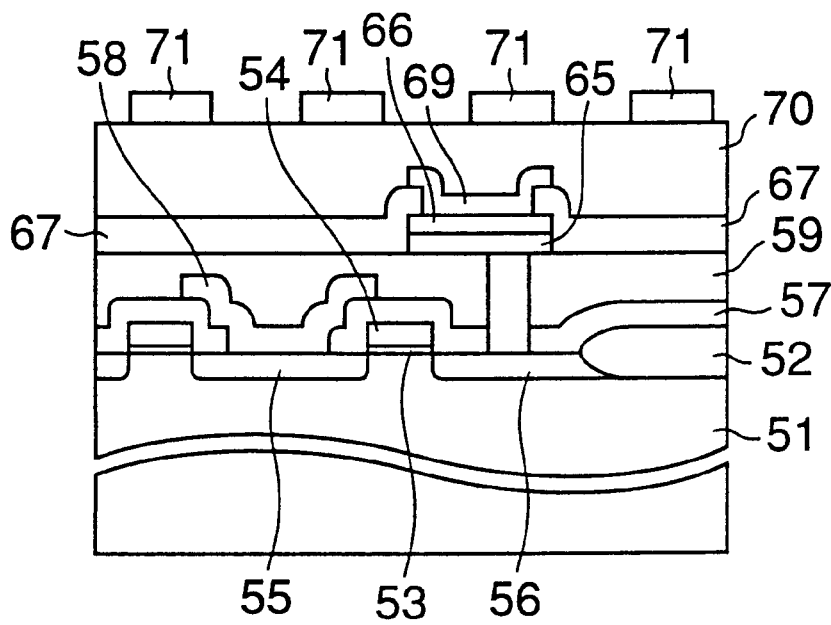

In the DRAM of FIG. 9H, it should be noted that the memory cell capacitor that uses $Ta_2O_5$ for the capacitor insulation film 66 has a very large capacitance. Thus, the memory cell capacitor can retain the information stably even when the memory cell is miniaturized below submicron size or sub-quarter micron size. It should further be noted that such a $Ta_2O_5$ film can be formed easily with excellent reproducibility and with low cost by conducting the sputtering process, low temperature oxidation process and further the rapid thermal annealing (RTA) process.

[THIRD EMBODIMENT]

Next, the fabrication process of a DRAM 80 according to a third embodiment of the present invention will be described with reference to FIGS. 10A–10G.

Figure 10A:
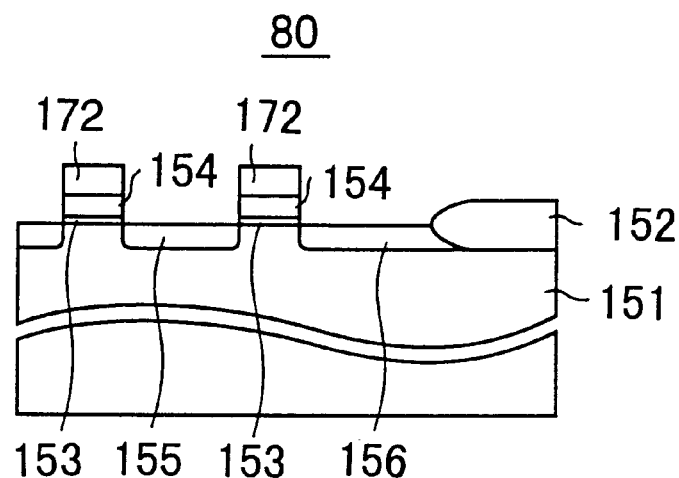
FIGS. 10A–10G are diagrams showing the fabrication process of a DRAM according to a third embodiment of the present invention.

Referring to FIG. 10A, a pair of gate electrodes 154 are formed on a memory cell region of a p-type Si substrate 151 defined by a field oxide film 152 similarly to the previous embodiment, wherein each of the gate electrodes 154 carries thereon an $SiO_2$ pattern 172 having a shape corresponding to the shape of the underlying gate electrode 154. Further, diffusion regions 155 and 156 of $n^+$-type are formed in the Si substrate 151 at the lateral sides of the gate electrodes 154, while it should be noted that the gate electrodes 154 in turn are formed in a self-alignment process that uses the $SiO_2$ pattern 172 as a self-alignment mask.

Figure 10B:
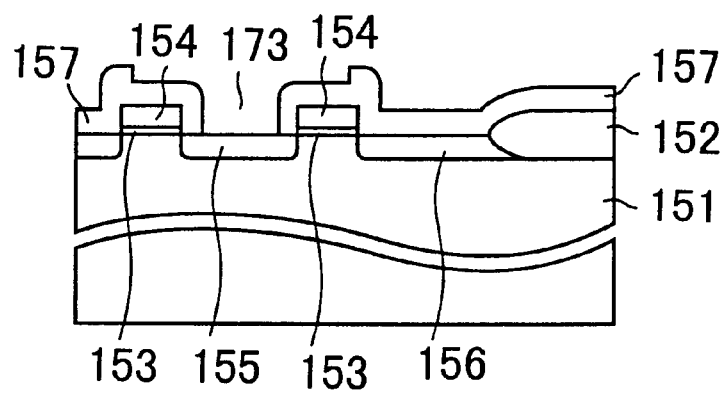

Next, in the step of FIG. 10B, the structure of FIG. 10A is covered by an $SiO_2$ film 157 similarly to the previous embodiment, and a self-aligned contact hole 173 exposing the diffusion region 155 is formed by applying an anisotropic etching process acting substantially vertically to the substrate 151 in the part of the $SiO_2$ film 157 corresponding to the diffusion region 155. It should be noted that the self-aligned contact hole 173 thus formed is defined by a side wall $SiO_2$ film 77 covering the side wall of the gate electrode 173.

Figure 10C:
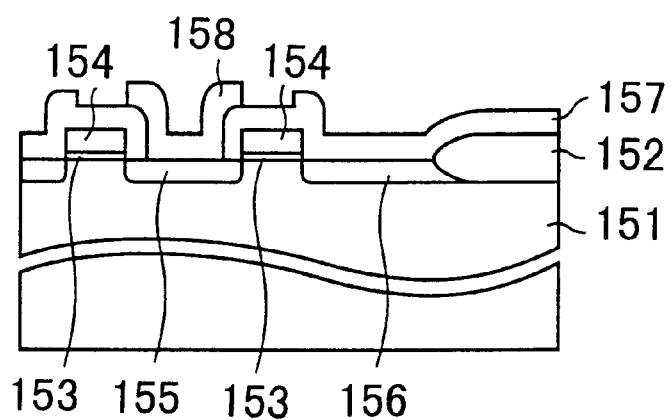

After the step of FIG. 10B, the step of FIG. 10C is conducted in which a bit line pattern 158 is formed in contact with the diffusion region 155 by depositing a WSi layer, followed by a patterning process of the WSi layer thus deposited.

Figure 10D:
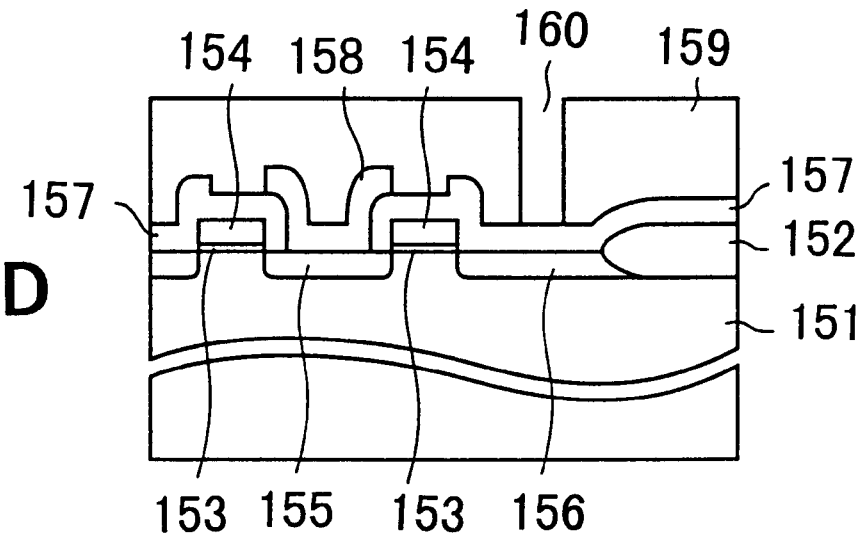

Next, in the step of FIG. 10D, an interlayer insulation film 159 is deposited on the structure of FIG. 10C, and after a planarization conducted by a CMP process, a contact hole 160 is formed in the interlayer insulation film 159 such that the contact hole 160 exposes the diffusion region 156. After the formation of the contact hole 160, an amorphous silicon film doped to the n-type by P is deposited by a CVD process, such that the amorphous silicon film fills the contact hole 160. By removing the part of the amorphous silicon film 160 located on the top surface of the interlayer insulation film 159, a conductive plug 162 is obtained from the amorphous silicon film 160 such that the conductive plug 162 fills the contact hole 160.

Figure 10E:
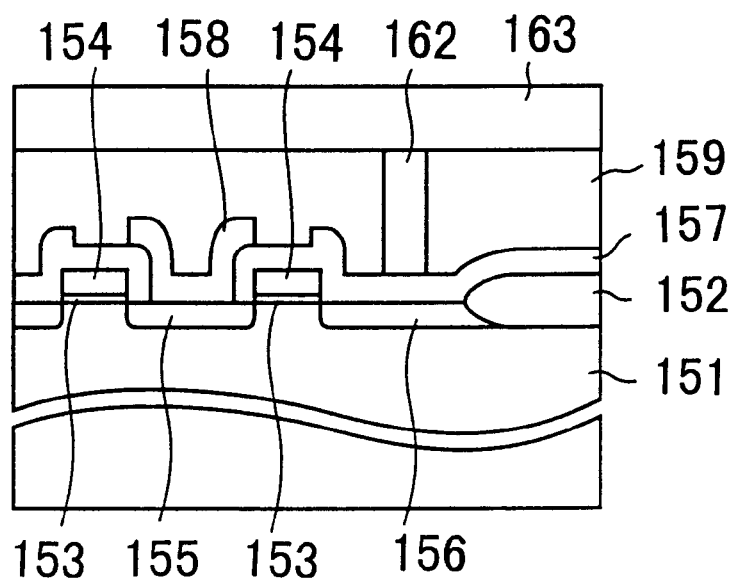

After the formation of the conductive plug 162, a Ti film is deposited in the step of FIG. 10E on the structure of FIG. 10D with a thickness of about 20 nm by a sputtering process that uses a Ti target. Further, a reactive sputtering of TiN is conducted on the Ti film thus deposited in an $N_2$ atmosphere by using the same Ti target. As a result, a TiN film is formed on the Ti film with a thickness of about 50 nm. It should be noted that the TiN film thus formed constitutes a part of a conductive film 163.

It should be noted that the rest of the conductive film 163 includes a Ru film, wherein the Ru film is deposited on the TiN film by a sputtering process that uses a Ru target with a thickness of about 100 nm. As a result, the conductive film 163 has a stacked structure of Ru/TiN/Ti.

Figure 10F:
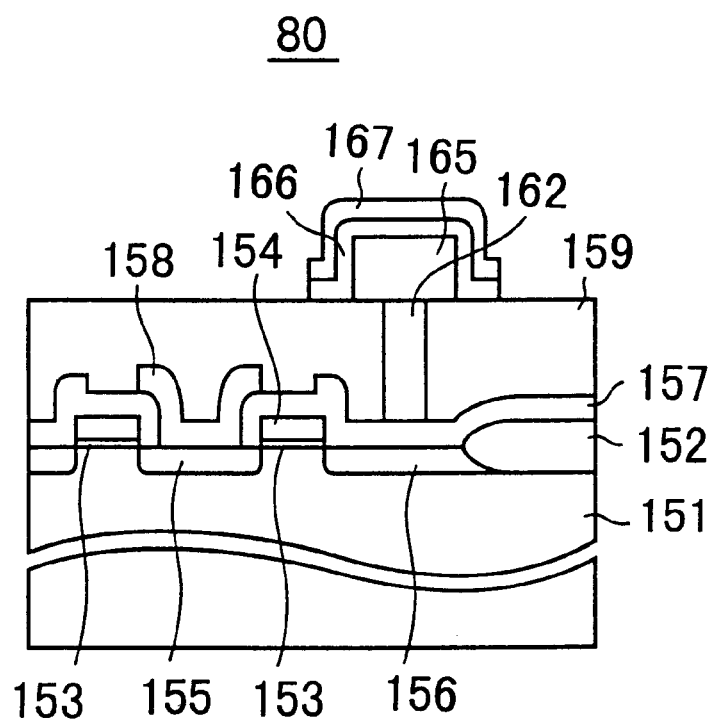

After the formation of the conductive film 163, the Ru film is patterned by a dry etching process or an ion milling process while using a resist pattern as a mask. Further, the TiN/Ti films are patterned by a dry etching process that uses a mixture of $CH_2Cl$ and $Cl_2$ as an etching gas while using the Ru pattern as a mask. As a result, a lower electrode having the Ru/TiN/Ti structure is formed on the interlayer insulation film 159 as represented in FIG. 10F. It should be noted that the Ru pattern constituting the lower electrode 165 has an (002)-oriented principal surface as explained already.

In the step of FIG. 17F, a $Ta_2O_5$ film 166 is formed on the lower electrode 165 by a sputtering process conducted in an Ar atmosphere. By exposing the $Ta_2O_5$ film 166 thus formed to an $N_2O$ plasma or $O_2$ plasma at the temperature of 280–300° C., the oxygen defects in the $Ta_2O_5$ film 166 are eliminated. Further, by applying a thermal annealing process to the $Ta_2O_5$ film 166 thus deposited in an $N_2$ atmosphere at the temperature of 700–850° C. for 20–120 seconds, the $Ta_2O_5$ film 166 undergoes crystallization. The $Ta_2O_5$ film 66 thus crystallized has a (001)oriented principal surface and shows a very large dielectric constant of 90–110.

Further, in the step of FIG. 10F, a Pt film is deposited further on the $Ta_2O_5$ film 166, wherein the Pt film thus deposited is patterned to form an upper electrode 169 by applying an ion milling process while using a resist pattern as a mask. Further, by patterning the $Ta_2O_5$ film 166 by an ion milling process while using the same resist pattern as a mask, a capacitor insulation film is formed from the $Ta_2O_5$ film 166. Thereby, the lower electrode 165, the capacitor insulation film 166 and the upper electrode 66 form together a high-dielectric capacitor connected electrically to the diffusion region 156 via the conductive plug 162.

Figure 10G:
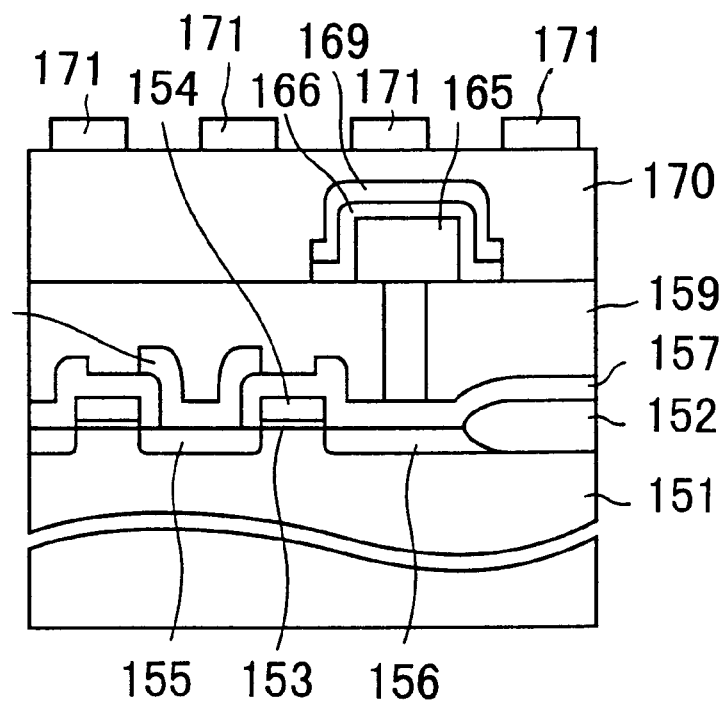

Finally, in the step of FIG. 10G, an interlayer insulation film 170 is deposited on the interlayer insulation film 159 so as to cover the high-dielectric capacitor and an interconnection pattern 171 of Al or an Al alloy is formed on the interlayer insulation film 170.

In the DRAM 80 of the present embodiment, too, the $Ta_2O_5$ film has a very large capacitance and the DRAM can stably retain the information therein even in such a case the DRAM is miniaturized to the size of submicrons or sub-quarter microns. The $Ta_2O_5$ film is formed easily and reliably with low cost, by a sputtering process followed by a low temperature oxidation process and rapid thermal annealing process.

Further, the present invention is not limited to the embodiments described heretofore, but various variations and modifications may be made without departing from the scope of the invention.

What is claimed is:

1. A high-dielectric capacitor, comprising:
   a lower electrode;
   a capacitor insulation film of $Ta_2O_5$ formed on said lower electrode; and
   an upper electrode formed on said capacitor insulation film,
   said capacitor insulation film having a dielectric constant exceeding 100.

2. A high-dielectric capacitor as claimed in claim 1 wherein said capacitor insulation film has a (001)-oriented principal surface.

3. A high-dielectric capacitor as claimed in claim 1, wherein said capacitor insulation film is formed of a columnar crystal of $Ta_2O_5$ having a (100)-oriented top surface.

4. A high-dielectric capacitor as claimed in claim 1, wherein said capacitor insulation film is formed of a substantially single crystal of $Ta_2O_5$ having a (100)-oriented top surface.

5. A high-dielectric capacitor as claimed in claim 1, wherein said lower electrode comprises a Ru film having a (002)-oriented principal surface, said capacitor insulation film being formed on said (002)-oriented principal surface of said lower electrode directly.

6. A high-dielectric capacitor as claimed in claim 5, wherein said lower electrode further includes an underlying structure comprising a Ti film having a (002)-oriented principal surface and a TiN film having a (111)-oriented principal surface and formed on said Ti film, said Ru film being formed on said underlying structure.

7. A semiconductor device, comprising:
   a substrate;
   a lower electrode provided on said substrate;
   a capacitor insulation film of $Ta_2O_5$ formed on said lower electrode; and
   an upper electrode formed on said capacitor insulation film;
   said capacitor insulation film having a dielectric constant exceeding 100 and comprising a crystal of $Ta_2O_5$ having a (001)-oriented surface.

8. A semiconductor device as claimed in claim 7, wherein said lower electrode further includes an underlying structure comprising a Ti film having a (002)-oriented principal surface and a TiN film having a (111)-oriented principal surface and formed on said Ti film, said Ru film being formed on said underlying structure.

* * * * *